United States Patent
Kwon

(12) United States Patent (10) Patent No.: US 6,312,518 B1
Kwon (45) Date of Patent: Nov. 6, 2001

(54) APPARATUS FOR FORMING A PHOTORESIST FILM IN A SEMICONDUCTOR DEVICE AND METHOD OF FORMING A PHOTORESIST FILM USING THE SAME

(75) Inventor: Chang Heon Kwon, Sungnam-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/561,296

(22) Filed: Apr. 28, 2000

Related U.S. Application Data

(62) Division of application No. 08/879,114, filed on Jun. 19, 1997, now Pat. No. 6,090,521.

(30) Foreign Application Priority Data

Jun. 29, 1996 (KR) .................................................. 96-25550

(51) Int. Cl.$^7$ ...................................................... B05C 5/02
(52) U.S. Cl. ................ 118/52; 118/56; 118/319; 118/320; 118/58; 118/66; 118/69
(58) Field of Search ................... 118/724, 725, 118/52, 56, 319, 320, 58, 63, 66, 69, 715

(56) References Cited

U.S. PATENT DOCUMENTS

| 5,120,634 | 6/1992 | Kobayashi . |
| 5,501,739 | * 3/1996 | Yamada et al. ...................... 118/719 |
| 5,536,534 | 7/1996 | Bae . |

\* cited by examiner

*Primary Examiner*—Laura Edwards
(74) *Attorney, Agent, or Firm*—Jacobson Holman, PLLC

(57) ABSTRACT

An apparatus for forming a photoresist film including a photoresist coating unit for coating a photoresist on a wafer, a first chamber in which a nitrogen gas of high pressure and low temperature is dispersed for planarizing the surface of the photoresist film formed on the wafer, the first chamber connected to the photoresist coating unit, and a second chamber in which a dried nitrogen gas of high temperature is dispersed for removing a solvent contained within the photoresist film and baking the photoresist film, the second chamber connected to the first chamber. During the baking process in the second chamber, heat is transferred from the photoresist film to the wafer by dispersing the dried nitrogen gas of high temperature from a nozzle at the upper side of the second chamber.

16 Claims, 3 Drawing Sheets

APPARATUS FOR FORMING A PHOTORESIST FILM IN A SEMICONDUCTOR DEVICE AND METHOD OF FORMING A PHOTORESIST FILM USING THE SAME

This is a divisional of U.S. application Ser. No. 08/879,114, filed Jun. 19, 1997, now U.S. Pat. No. 6,090,521.

BACKGROUND OF THE INVENTION

1. Field of the Invention

The present invention relates to an apparatus for forming a photoresist film in a semiconductor device and method of forming a photoresist film using the same and, more particularly, to an apparatus for forming a photoresist film and method of forming a photoresist film using the same which can form an uniform photoresist film through a post-process performed in a first and a second chambers after forming a photoresist film on a wafer.

2. Description of the Prior Arts

Generally, a photolithography process for manufacturing a semiconductor device involves a coating process, a light exposure process, and a develop process for a photoresist film. In the coating process, the photoresist is dispensed on the wafer fixed at a spin chuck under a vacuum state. After the dispensing of photoresist is completed, the spin chuck is rotated at a high speed. Also, the wafer is rotated, thus, the photoresist dispensed on center portion of the wafer is dispersed uniformly on entire surface of the wafer by a centrifugal force. After coating process, the baking process is performed to remove a solvent contained in the photoresist film 9.

As shown In FIG. 1A, microscopic riffle waves A which can not be seen by a human's eye are existed on the surface of the photoresist film 9 coated on the wafer 8 by this process. Also, as shown in FIG. 1B, a plurality of pin holes B and peeling portions C are formed in the photoresist film 9. At this state, if the exposure process is performed, the microscopic riffle waves A, the pin holes B and the lifting portions C have caused a microscopic defocus.

In addition, in the baking process, the wafer 9 is loaded on a heater block or loaded in a bake oven. The wafer is heated on the heater block in contact heating manner or in the bake oven in heat convention manner. Therefore, the photoresist film 9 is not dried uniformly, especially an inner portion of the photoresist film 9 is not dried completely. Also, in case of using the heater block, since the heat is transferred from a bottom surface of the wafer to the photoresist film, the pattern can be damaged by the heat, thereby lowering the. characteristic of device.

SUMMARY OF THE INVENTION

It is therefore an object of the present invention to provide an apparatus and method for forming a photoresist film which can planarize a surface of the photoresist film and dry the photoresist film completely.

An apparatus for forming a photoresist film according to the present invention comprises a photoresist coating unit for coating a photoresist on a wafer, a first chamber in which a nitrogen gas of high pressure gas is dispersed for plananrzing a surface of the photoresist film formed on the wafer, and a second chamber in which a dried nitrogen gas of high temperature is dispersed for removing a solvent contained within the photoresist film and to bake the photoresist film.

The nitrogen gas dispersed in the first chamber is dispersed with a temperature of 4 through 20 degree Celsius and a high pressure of 150 through 250 psi, the dried nitrogen gas dispersed in the second chamber is dispersed with a high temperature of 100 through 200 degree Celsius and a pressure of 50 through 150 psi.

BRIEF DESCRIPTION OF THE DRAWINGS

Other objects and advantages of the present invention will be understood by reading the detailed explanation of the embodiment with reference to the accompanying drawings in which.

DESCRIPTION OF THE INVENTION

An apparatus and method of forming a photoresist film according to the present invention will be explained in detail by reference with the acgoipanying drawings.

Figure 1A:
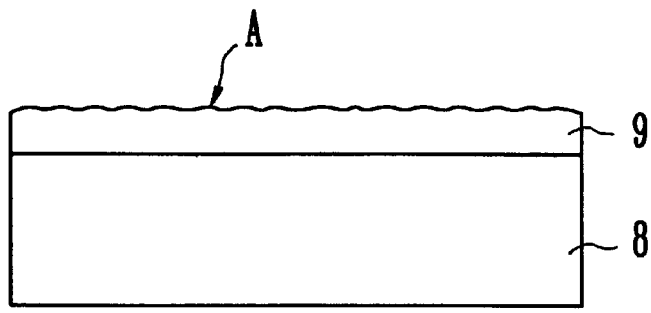
FIGS. 1A and 1B are cross-sectional views of a device for illustrating a conventional method of forming a photoresist film in a semiconductor device.
Figure 1B:
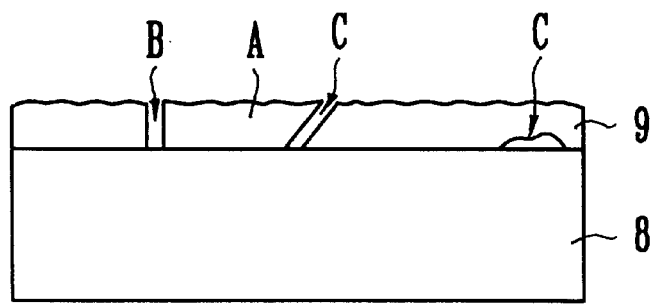
Figure 2:
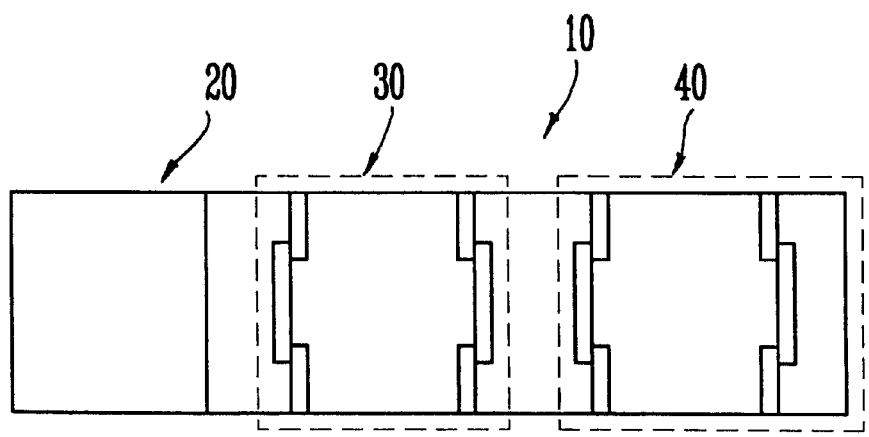
FIG. 2 is a plane view of an apparatus according to the present invention.

Referring to FIG. 2, an apparatus 10 for forming a photoresist film comprises a photoresist coating unit 20, a first chamber 30 and a second chamber 40. The photoresist coating unit 20, the first chamber 30 and the second chamber 40 are installed in a space, and the wafer is transferred to the photoresist coating unit 20, the first chamber 30 and the second chamber 40, sequentially, by the wafer transfer system.

The photoresist coating unit 20 comprises a nozzle for dispensing a photoresist on surface of the wafer and, a conventional spinner for rotating a wafer.

Figure 3A:
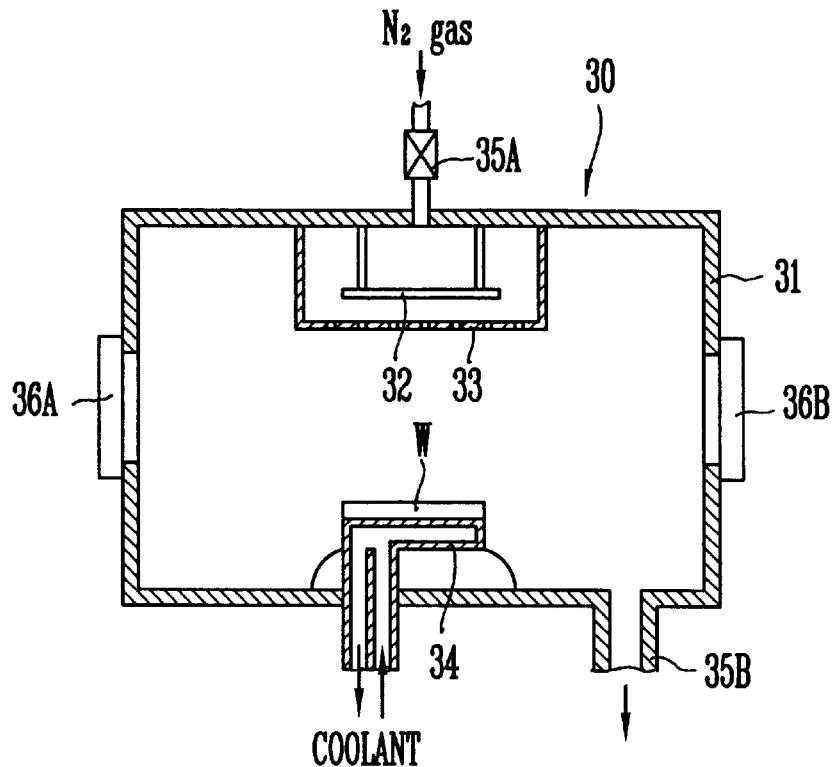
FIG. 3A is a cross-sectional view of a first chamber shown in FIG. 2.

As shown in FIG. 3A, the first chamber 30 comprises a housing 31. A gas supplying tube 35A is connected to an upper end of the housing 31, and a buffer 32 and diffuser 33 are mounted under the gas supplying tube 35A. At the bottom of the housing 31, a chill plate 34 for mounting and cooling a wafer W on which a photoresist film is formed is located, and an exhaust outlet 35B is also formed. In addition, a wafer loading door 36A and unloading door 36 are formed at the sides of the housing 31, respectively.

Nitrogen gas (N$_2$ gas) of high pressure and low temperature is supplied into the housing 31 through the gas supplying tube 35A. A flow rate of nitrogen gas is reduced by the buffer 32, and nitrogen gas is dispersed evenly through the diffuser 33 having a plurality of fine holes. Coolant of temperature of about 4 degree Celsius is circulated in the chill plate 34 on which the wafer W is mounted, therefore, the wafer W is cooled.

Figure 3B:
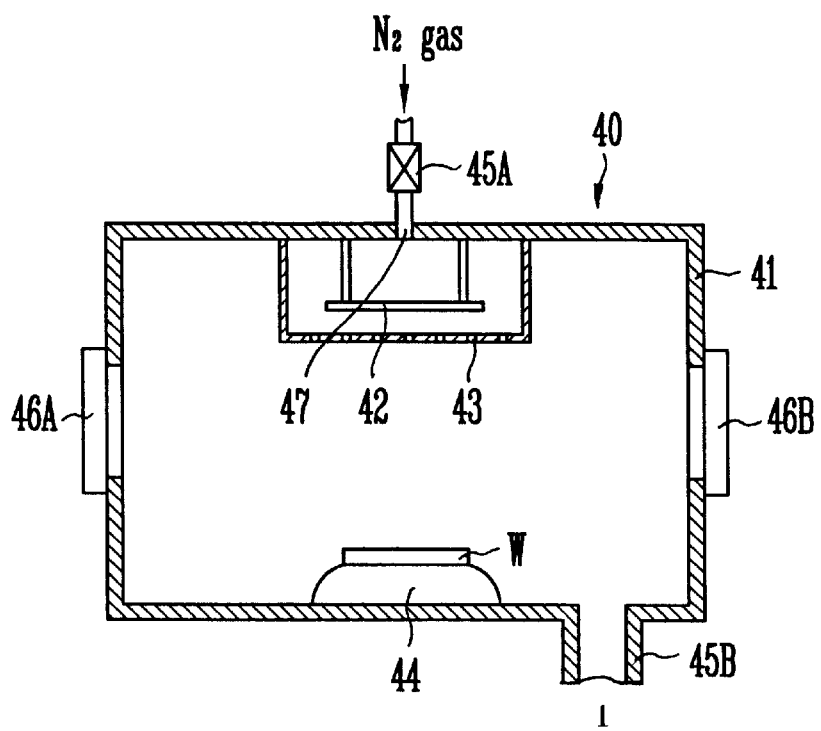
FIG. 3B is a cross-sectional view of a second chamber shown in FIG. 2.

As shown in FIG. 3B, the second chamber 40 comprises a housing 41. A gas supplying tube 45A is connected to an upper end of the housing 41 through a nozzle 47, and a buffer 42 and diffuser 43 are mounted under the gas supplying tube 45A. At the bottom of the housing 41, a vacuum chuck 44 for chucking the wafer W is located, and an exhaust outlet 45B is also formed. In addition, a wafer loading door 46A and unloading door 46B are formed at the sides of the housing 41, respectively.

Dried $N_2$ gas of high temperature is supplied into the housing 41 through the gas supplying tube 45A. A flow rate of nitrogen gas is reduced by the buffer 42, and the dried $N_2$ gas is dispersed through the diffuser 43 having a plurality of fine holes.

Meanwhile, the apparatus 10 further comprises wafer transfer systems (not shown) for transferring the wafer W from the photoresist coating unit 20 to the first chamber 30 and transferring the wafer W from the first chamber 30 to the second chamber 40, respectively. The wafer transfer systems are located between the photoresist coating unit 20 and the first chamber 30, and between the first chamber 30 and the second chamber 40, respectively.

Figure 4A:
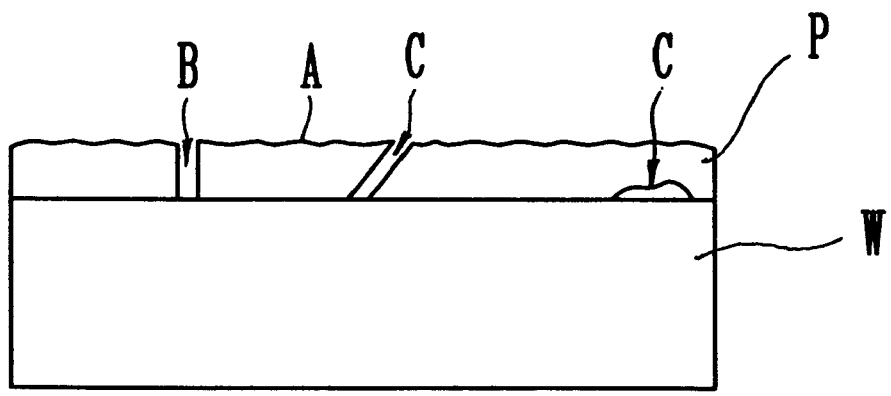
FIGS. 4A and 4B are cross-sectional views of a device for illustrating a method of forming a photoresist film in accordance with the present invention.

The method of forming a photoresist film using the apparatus described above will be explained as follow;

Referring to FIG. 4A, a photoresist film P is formed on the wafer W by means of the photoresist coating unit 10. As described above, microscopic riffle waves A, pin holes B and peeling portions C which can not be seen by a human's eye are formed in the photoresist film P.

After finishing the photoresist coating process, the wafer W as shown in FIG. 4A is transferred from the photoresist coating unit 20 to the first chamber 30 through the wafer loading door 36A, and then mounted on the chill plate 34. The $N_2$ gas of low temperature and high pressure is supplied through the gas supplying tube 35A, and the $N_2$ gas is dispersed by the diffuser 33. Therefore, the $N_2$ gas pressures the surface of the wafer W, uniformly. During the process in the first chamber 30, the $N_2$ gas dispersed in the first chamber has a temperature of from 4 to 20° C. and presses the surface of the-photoresist film P with a pressure of approximately 150 through 250 psi for about 1 through 10 minutes.

Figure 4B:
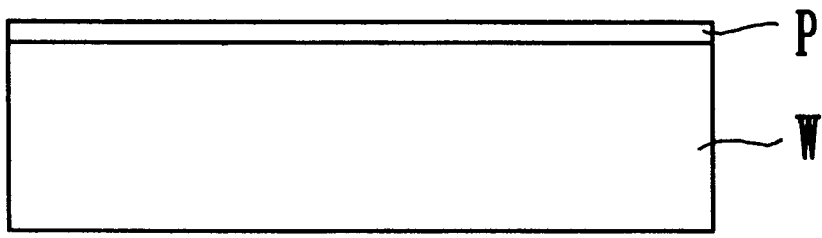

FIG. 4B is a cross sectional view of device showing a condition of the photoresist film after dispersing the $N_2$ gas of high pressure. As shown in FIG. 4B, the microscopic riffle waves A, the pin holes B and the peeling portions C are disappeared and the thickness of the photoresist film P becomes thin evenly by dispersing of the N2 gas of a high pressure.

After dispersing the $N_2$ of high pressure on the wafer W, the wafer W as shown in FIG. 4B is transferred from the first chamber 30 to the second chamber 40 through the wafer unloading door 36B of the first chamber 30 and the loading door 46A of the second chamber 40, and the wafer W is mounted on the vacuum chuck 44. The dried $N_2$ gas of high temperature and air are supplied, alternately, through the gas supplying tube 45A. The $N_2$ gas is dispersed by the diffuser 43. Therefore, the solvent contained within the photoresist film P is vaporized by the dried $N_2$ gas of high temperature, and the photoresist film P becomes a solid state. During the drying process in the second chamber 40, the dried $N_2$ gas dispersed in the second chamber has a temperature of from 100 to 200° C. and presses the surface of the photoresist film P with a pressure of approximately 50 through 150 psi for about 2 through 10 minutes.

Meanwhile, during a baking process in the second chamber 40, since heat is transferred from a top surface, that is, the photoresist film P to the wafer W by dispersing the dried nitrogen gas of high temperature from the nozzle 47 at the upper side of the second chamber, the baking efficiency is enhanced and damage to the pattern formed in the wafer can be minimized.

As mentioned above, in the present invention, microscopic riffle waves, pin holes, and a peeling portion formed in the photoresist film can be elimated and the thickness of the photoresist film becomes thin evenly by dispersing of $N_2$ gas of a high pressure. Also, solvent contained within the photoresist film is removed by dispersing of $N_2$ gas with a high temperature. In addition, the baking efficiency of the photoresist can be enhanced, and damage of the wafer can be minimized.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. An apparatus for forming a photoresist film in a semiconductor device, comprising:

a photoresist coating unit for coating a photoresist on a wafer;

a first chamber in which a nitrogen gas of high pressure and low temperature is dispersed for planarizing a surface of the photoresist film formed on said wafer, said first chamber connected to said photoresist coating unit; and a second chamber in which a dried nitrogen gas of high temperature is dispersed for removing a solvent contained within the photoresist film and for baking the photoresist film, said second chamber connected to said first chamber, wherein during the baking process in the second chamber, heat is transferred from the photoresist film to the wafer by dispersing the dried nitrogen gas of high temperature from a nozzle at an upper side of the second chamber.

2. The apparatus for forming a photoresist film in a semiconductor device as claimed in claim 1, wherein s aid first chamber comprises; a housing;

a gas supplying tube connected to upper end of said housing;

a chill plate for mounting and cooling said wafer transferred from said photoresist coating unit;

a wafer loading door for receiving said wafer transferred from the said photoresist coating unit, and an unloading door for transferring said wafer to said second chamber, said wafer loading door and unloading door formed at both side walls of the said housing, respectively.

3. The apparatus for forming a photoresist film in a semiconductor device as claimed in claim 2, wherein said first chamber further comprises a buffer for reducing a flow rate of said nitrogen gas and a diffuser for dispersing said nitrogen gas, said buffer and diffuser mounted under said gas supplying tube.

4. The apparatus for forming a photoresist film in a semiconductor device as claimed in claim 1, wherein said first chamber is able to withstand receiving said nitrogen gas dispersed in said first chamber at a temperature of between 4 and 20 degrees Celsius and at a high pressure of between 150 and 250 psi.

5. The apparatus for forming a photoresist film in a semiconductor device as claimed in claim 1, wherein said second chamber comprises;

a housing;

a gas supplying tube connected to upper end of said housing;

a vacuum chuck for mounting said wafer transferred from said first chamber;

a wafer loading door for receiving said wafer transferred from the said first chamber, and an unloading door for transferring said wafer, said wafer loading door and unloading door formed at both side walls of the said housing, respectively.

6. The apparatus for forming a photoresist film in a semiconductor device as claimed in claim 5, wherein said second chamber further comprises a buffer for reducing a flow rate of said nitrogen gas and a diffuser for dispersing said nitrogen gas, said buffer and diffuser mounted under said gas supplying tube.

7. The apparatus for forming a photoresist film in a semiconductor device as claimed in claim 1, wherein said second chamber is able to withstand receiving said dried nitrogen gas dispersed in said second chamber at a high temperature of between 100 and 200 degrees Celsius and at a pressure of between 50 and 150 psi.

8. The apparatus for forming a photoresist film in a semiconductor device as claimed in claim 1, wherein said nozzle disperses said dried nitrogen gas such that said dried nitrogen gas presses the surface of the photoresist film with a pressure of between 50 and 150 psi.

9. The apparatus for forming a photoresist film in a semiconductor device as claimed in claim 1, wherein said first chamber includes a gas supplying tube that disperses said nitrogen gas such that said nitrogen gas presses the surface of the photoresist film with a pressure of between 150 and 250 psi.

10. An apparatus for forming a photoresist film in a semiconductor device, comprising:
   a photoresist coating unit for coating a photoresist on a wafer;
   a first chamber in which a nitrogen gas of high pressure and low temperature is dispersed for planarizing a surface of the photoresist film formed on said wafer, said first chamber connected to said photoresist coating unit, said first chamber able to receive said nitrogen gas at temperatures ranging from approximately 4 to 20 degrees Celsius and at pressures of approximately 150 to 250 psi; and
   a second chamber in which a dried nitrogen gas of high temperature is dispersed for removing a solvent contained within the photoresist film and for baking the photoresist film, said second chamber connected to said first chamber, said second chamber including a nozzle at an upper side thereof for dispersing the dried nitrogen gas so that, during the baking process in the second chamber, heat is transferred from the photoresist film to the wafer, enhancing baking efficiency.

11. The apparatus for forming a photoresist film in a semiconductor device as claimed in claim 10, wherein said second chamber is able to receive said dried nitrogen gas dispersed through said nozzle at a high temperature of approximately 100 to 200 degrees Celsius and at a pressure of between 50 and 150 psi.

12. The apparatus for forming a photoresist film in a semiconductor device as claimed in claim 10, wherein said nozzle disperses said dried nitrogen gas such that said dried nitrogen gas presses the surface of the photoresist film with a pressure of between 50 and 150 psi.

13. The apparatus for forming a photoresist film in a semiconductor device as claimed in claim 1, wherein said first chamber includes a gas supplying tube that disperses said nitrogen gas such that said nitrogen gas presses the surface of the photoresist film with a pressure of between 150 and 250 psi.

14. An apparatus for forming a photoresist film in a semiconductor device, comprising:
   a photoresist coating unit for coating a photoresist on a wafer;
   a first chamber in which a nitrogen gas of high pressure and low temperature is dispersed for planarizing a surface of the photoresist film formed on said wafer, said first chamber connected to said photoresist coating unit and including a gas supplying tube, a first buffer located beneath an outlet of said gas supplying tube for reducing a flow rate of said nitrogen gas, and a first diffuser located beneath said first buffer for dispersing said nitrogen gas, said gas supplying tube dispersing said nitrogen gas such that said nitrogen gas presses the surface of the photoresist film with a pressure of between 150 and 250 psi; and
   a second chamber in which a dried nitrogen gas of high temperature is dispersed for removing a solvent contained within the photoresist film and for baking the photoresist film, said second chamber connected to said first chamber and including a nozzle at an upper side thereof for dispersing the dried nitrogen gas, a second buffer located beneath the nozzle for reducing a flow rate of said dried nitrogen gas, and a second diffuser located beneath said second buffer for dispersing said dried nitrogen gas, said nozzle dispersing said dried nitrogen gas such that said dried nitrogen gas presses the surface of the photoresist film with a pressure of between 50 and 150 psi.

15. The apparatus for forming a photoresist film in a semiconductor device as claimed in claim 14, wherein said first chamber is able to receive said nitrogen gas at temperatures ranging from approximately 4 to 20 degrees Celsius.

16. The apparatus for forming a photoresist film in a semiconductor device as claimed in claim 15, wherein said second chamber is able to receive said dried nitrogen gas dispersed through said nozzle at a high temperature of approximately 100 to 200 degrees Celsius.

* * * * *